(12) United States Patent
Coker et al.

(10) Patent No.: US 9,059,737 B2
(45) Date of Patent: Jun. 16, 2015

(54) DISK DRIVE WITH DISTRIBUTED CODEWORD BLOCKS

(71) Applicant: HGST Netherlands B.V., Amsterdam (NL)

(72) Inventors: Jonathan Darrel Coker, Rochester, MN (US); Richard Leo Galbraith, Rochester, MN (US); Weldon Mark Hanson, Rochester, MN (US); Travis Roger Oenning, Rochester, MN (US); Roger William Wood, Gilroy, CA (US)

(73) Assignee: HGST Netherlands B.V., Amsterdam (NL)

( * ) Notice: Subject to any disclaimer, the term of this patent is extended or adjusted under 35 U.S.C. 154(b) by 127 days.

(21) Appl. No.: 13/875,165

(22) Filed: May 1, 2013

(65) Prior Publication Data

US 2014/0201590 A1 Jul. 17, 2014

Related U.S. Application Data

(60) Provisional application No. 61/751,684, filed on Jan. 11, 2013.

(51) Int. Cl.
*H03M 13/00* (2006.01)
*H03M 13/11* (2006.01)
*G11B 20/12* (2006.01)
*G11B 20/18* (2006.01)
*H03M 13/27* (2006.01)
*H03M 13/37* (2006.01)
*H03M 13/09* (2006.01)

(52) U.S. Cl.
CPC ....... *H03M 13/1102* (2013.01); *G11B 20/1217* (2013.01); *G11B 20/1833* (2013.01); *H03M 13/09* (2013.01); *H03M 13/27* (2013.01); *H03M 13/373* (2013.01); *H03M 13/3761* (2013.01)

(58) Field of Classification Search
None
See application file for complete search history.

(56) References Cited

U.S. PATENT DOCUMENTS

| | | | |
|---|---|---|---|
| 7,113,362 B1 | 9/2006 | Lee et al. | |
| 7,231,578 B2 * | 6/2007 | Hassner et al. | 714/762 |
| 7,490,284 B2 * | 2/2009 | Vityaev | 714/795 |
| 7,562,282 B1 * | 7/2009 | Rothberg | 714/785 |
| 7,590,920 B2 * | 9/2009 | Yang et al. | 714/774 |
| 7,644,336 B2 * | 1/2010 | Yang et al. | 714/755 |
| 2005/0060635 A1 | 3/2005 | Eroz et al. | |

(Continued)

OTHER PUBLICATIONS

Ravi Motwani; "Exploitation of RBER Diversity across Dies to Improve ECC Performance in NAND Flash Drive"; presented at Flash Memory Summit 2012 Santa Clara, CA; Aug. 23, 2012. Published on the Internet at URL: http://www.flashmemorysummit.com/English/Collaterals/Proceedings/2012/20120823_S301B_Motwani.pdf.

(Continued)

*Primary Examiner* — Daniel McMahon
(74) *Attorney, Agent, or Firm* — G. Marlin Knight

(57) ABSTRACT

Disk drives are described in which blocks of data spanning multiple sectors are encoded into a plurality of codewords which are then divided into segments that are physically separated (distributed) on the disk surface over multiple sectors in a distributed codeword block so that the codewords have an improved worst case SNR in comparison to individual sectors. This results in more even SNR performance for each codeword, which improves the performance for portions of a track which have lower than the average SNR. Embodiments are described in which the distributed codeword blocks span across tracks.

17 Claims, 5 Drawing Sheets

(56) References Cited

U.S. PATENT DOCUMENTS

| | | | |
|---|---|---|---|
| 2005/0229069 A1* | 10/2005 | Hassner et al. | 714/746 |
| 2007/0043997 A1* | 2/2007 | Yang et al. | 714/758 |
| 2007/0245214 A1 | 10/2007 | Ramamoorthy | |
| 2008/0080641 A1* | 4/2008 | Kim | 375/299 |
| 2009/0254796 A1* | 10/2009 | Hassner et al. | 714/780 |
| 2011/0264980 A1 | 10/2011 | Li et al. | |
| 2014/0122963 A1* | 5/2014 | Motwani et al. | 714/758 |
| 2014/0122973 A1* | 5/2014 | Motwani | 714/773 |
| 2014/0229806 A1* | 8/2014 | Li et al. | 714/785 |

OTHER PUBLICATIONS

Marwan H. Azmi, et al.; "Design of Distributed Multi-Edge Type LDPC Codes for Two-Way Relay Channels," 978-1-61284-233-2/11 2011 IEEE. IEEE International Conference on Communications (ICC) at Kyoto, Japan on Jun. 5-9, 2011. Digital Object Identifier: 10.1109/icc.2011.5962625. pp. 1-5; ISSN: 1550-3607. E-ISBN : 978-1-61284-231-8. Print ISBN: 978-1-61284-232-5.

\* cited by examiner

DISK DRIVE WITH DISTRIBUTED CODEWORD BLOCKS

RELATED APPLICATION

Provisional Application 61/751,684 filed Jan. 11, 2013 is included by reference herein and benefit of the priority date is hereby claimed.

FIELD OF THE INVENTION

The invention relates to methods and systems for encoding and decoding stored data in storage systems, such as disk drives, in a form that includes additional information that allows for the detection of errors.

BACKGROUND

Error correcting codes (ECC) in disk drives have traditionally use fixed length codewords that include a fixed length set of data bits and a set of ECC bits that are mathematically derived from the set of data bits. Conventionally each sector on a track in a disk drive was designed as an ECC codeword. However, interleaving of codewords and multilevel codes have been described. See, for example, U.S. Pat. No. 4,525,838 to Patel (Jun. 25, 1985) which describes a multibyte error correcting system which employs a two-level code structure consisting of subblocks within a block. Each subblock includes two or more interleaved primary codewords.

One linear error correcting code (ECC) that can be used in disk drives is a low-density parity-check (LDPC) code. LDPC codes are also referred to as Gallager codes. Even though the term ECC literally implies that errors can be corrected, in practice the term is used loosely to include systems that only provide error detection. So an LDPC implementation in a disk drive may not include any ability to correct errors.

In US published patent application 20120159285 (Jun. 21, 2012), Ravi Motwani describes storage drives with LDPC encoded data in which an errantly read memory unit (e.g., faulty LDPC codeword) may be recovered. NAND flash storage drives memory modules (e.g., dies) are written with LDPC codewords. improved UBER (unrecoverable bit error rate) performance may be attained. N separate dies are provided for the storage drive memory. Motwani has also described a concept wherein the LDPC codewords are spread across dies. The raw bit error rate (RBER) tolerance is said to improve as number of dies in the spread increases. A drawback is that the read/access time increases. See Mustafa Eroz, et al. have described a method for providing short block length low density parity check (LDPC) codes. (US published patent application 20050060635, Mar. 17, 2005.) An LDPC encoder generates a short LDPC code by shortening longer mother codes. The short LDPC code has an outer Bose Chaudhuri Hocquenghem (BCH) code. For an LDPC code with code rate of 3/5 utilizing 8-PSK (Phase Shift Keying) modulation, an interleaver provides for interleaving bits of the output LDPC code by serially writing data associated with the LDPC code column-wise into a table and reading the data row-wise from right to left.

In US published patent application 20070245214 (Oct. 18, 2007) Aditya Ramamoorthy described multi-level signal memory cells with LDPC and interleaving. A low density parity check (LDPC) coder is used with an interleaver adapted to apply bit interleaved code modulation (BICM) to the LDPC coded data values to generate BICM coded data values.

Zongwang Li, et al. have described a multi-tier LDPC encoding/decoding system with interleaving on a single track of a disk drive in US published patent application 20110264980, Oct. 27, 2011. An interleaver circuit interleaves the output of a first channel detector and separately interleaves the output of a second channel detector using two ping pong buffers.

Marwan H. Azmi, et al. have discussed the problem of finding the optimum degree distribution for the distributed LDPC codes in two-way relay channels. In a framework of multi-edge type (MET) LDPC codes, their methodology asymptotically optimizes the code's ensemble when different segments within the distributed codeword have been transmitted through different channels and experience different signal-to-noise ratios (SNRs). An average noise threshold is formulated to compute the convergence threshold of the distributed LDPC codes under density evolution and acts as the performance gap between the optimized distributed codes and the theoretical limit. See "Design of Distributed Multi-Edge Type LDPC Codes for Two-Way Relay Channels," Marwan H. Azmi, Jun Li, Jinhong Yuan and Robert Malaney; 978-1-61284-233-2/11 2011 IEEE.

A problem addressed by embodiments of the present invention is the capacity degradation caused by signal-to-noise ratio (SNR) variation around a disk track and across the track. The SNR variation around a track is due to various factors including track misregistration (TMR), media variation, fly height variations during reading and writing operations, etc. Using the prior art, the capacity limit around a track is limited by approximately the worst case SNR at any point around a track. An object of embodiments of the invention is to improve the capacity around a track to the limit set by the average SNR around a track.

SUMMARY OF THE INVENTION

Embodiments of the invention divide the codewords used to store data into segments that are physically separated (distributed) on the disk surface over multiple sectors so that the distributed codewords have a minimum SNR that is higher than the minimum SNR for individual sectors, i.e. the worst case SNR is improved for the distributed codewords. This results in more even SNR performance for each codeword, which improves the performance for portions of a track which have lower than the average SNR. Embodiments will be described using LDPC codewords, but embodiments are not dependent any particular choice of coding algorithm. Embodiments allow the use of LDPC codewords that are relatively small (and can be efficiently implemented) but achieve the SNR benefits of much larger codeword sizes through the distribution technique. In various embodiments the codewords can be distributed on a single track and/or across tracks. Embodiments use a block of user data that is a multiple of the selected codeword size to form a block of codewords in which segments of each codeword are distributed throughout the block. For example, a 32 kB block of user data that includes 8 logical sectors can be processed into 8 codewords that are then divided into segments and distributed over 8 physical sectors. In the distributed codeword block each logical sector of user data is spread out in a predetermined pattern in the 8 physical sectors to achieve the SNR averaging benefit.

An optimal codeword distribution span/length in the down-track direction can be chosen by using the correlation length of the SNR variation due to TMR, fly height variation, etc. for a targeted disk drive system. The maximum SNR improvement is the difference between the worst case single sector SNR around the track versus the average SNR of the entire the track.

A significant cause of SNR variation between tracks is from variations in the effective width of a track (known as track squeeze) caused by errors in radial positioning of the actuator by the servo system. Embodiments that distribute each LDPC codeword in the cross-track direction are particularly effective in reducing the effects of SNR from track squeeze. These embodiments are synergistic with the use of Multiple-Inputs/Multiple Outputs (MIMO) technology. For example, in 3-read head MIMO, each LDPC codeword can be efficiently distributed over 3 adjacent tracks, instead of just one. Since adjacent tracks tend to have inversely correlated/ different squeeze characteristics, this cross-track distribution also leads to improved SNR performance. Embodiments that only use cross track distribution in a MIMO disk drive will have no added latency since no additional down track reading is required to obtain the entire codeword.

The embodiments described herein assume that the disk drive uses shingled magnetic recording (SMR) which allows the reading and writing of the relatively large data block sizes without a significant performance penalty.

DETAILED DESCRIPTION OF THE INVENTION

The embodiments described herein assume that the disk drive uses shingled magnetic recording (SMR). Some brief points about SMR disk drives will be noted. Shingled magnetic recording (SMR) allows large blocks such as are used for a distribution block in embodiments to be written without performance penalty. In contrast perpendicular magnetic recording (PMR) would require a read-modify-write sequence to achieve 32 kB or 64 kB block size with 4 kB emulation, which would result in a high performance penalty. Conventional disk drives with magnetic media organize data in concentric tracks that are spaced equally apart. Shingled writing is a way of increasing the areal density of magnetic recording. In SMR drives a region (band) of adjacent tracks are sequentially written with each track overlapping the previously written track. The shingled tracks in a region must be written in sequence unlike conventionally separated tracks, which can be written in any order. Once written in shingled structure, an individual track cannot be updated in place, because that would overwrite and destroy the data in the overlapping tracks. Accordingly SMR drives need to maintain caches and areas of the disk where data can be temporarily stored. Read/write commands received by the system use logical sector addresses for data and users must generally be shielded from the SMR drive's internal data movements. Thus, an SMR drive needs to maintain an indirect addressing system in which logical sector addresses are mapped to locations in one of the various categories of internal storage available to the drive. When the drive destages a sector of data from a cache, as one example, the indirect addressing system's map is updated, but the logical address for that sector of data remains unchanged.

Figure 1:
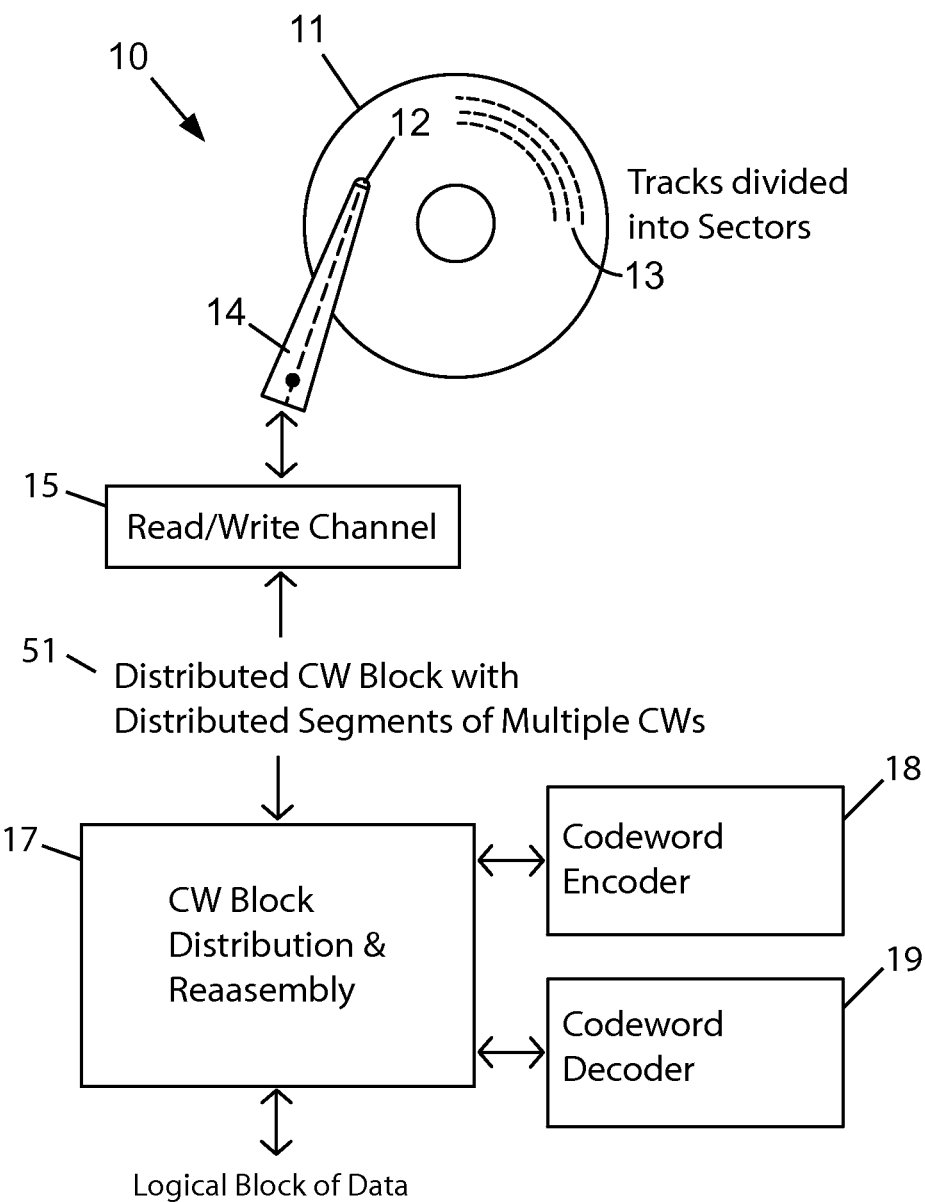
FIG. 1 is a block diagram of selected functional components in disk drive according to an embodiment of the invention.

FIG. 1 is a block diagram of selected functional components in disk drive 10 according to an embodiment of the invention. The information stored in the magnetic media on disk 10 is organized in tracks 13 which are divided into a plurality of sectors. Although disk drive tracks are generally concentric rings, spiral tracks are known in the art and can be used with embodiments of the invention. The read and write heads 12 are selectively positioned over a track when the disk is rotating by pivoting actuator 14. Typically there is only one read head and one write for each disk surface, but designs that include multiple read heads are known. The embodiments that distribute codeword blocks across tracks is particularly useful in a drive with multiple read heads that can simultaneously read all tracks in codeword block. The signals to and from the heads are generated and processed by read/write channel components 15.

The flow of data for read and writing is managed in blocks of data that are of a size selected to be a multiple of the sector size. The codeword block distribution and reassembly unit 17 accepts a logical block of data of the selected size and processes it into a distributed codeword block 51 in which segments of the multiple codewords are distributed over a selected span of physical sectors.

The set of physical sectors can all be on a single track in a particular embodiment but can span across tracks in other embodiments. The selected physical sectors can conveniently be a contiguous block, but at the price of added complexity, schemes using noncontiguous sectors can be devised according to the principles disclosed herein. The selected span of the distribution is preferably fixed in the design of disk drive.

The codeword block distribution and reassembly unit 17 uses codeword encoder 18 to generate an individual codeword from a unit of data according to the prior art. The use LDPC codes is assumed in the embodiments described herein, but alternative embodiments can use any ECC coding method that is otherwise appropriate for use in disk drives. Similarly codeword decoder 19 functions according to the prior art and is used to extract the data from the codeword and provide error checking. Embodiments of the invention can be used in systems with or without error correcting capability.

An exemplary first embodiment will be described that distributes codewords on a single track. This embodiment implements a relatively large distribution block size, for example 32 kB of user data, which is mapped into eight 4 kB user data length sectors. The user data LDPC codeword size is also 4 kB. The 32kB block of user data is processed into eight LDPC codewords that each have 4 kB of user data. Other choices can be made for the sizes of these units in other embodiments.

Embodiments of the invention differ from prior art techniques by using a relatively small LDPC codeword (e.g. 4 kB in length) that is divided into segments that are distributed over a much larger physical area compared to the codewords that are use a contiguous/sequential area of a track. This physical distribution allows each codeword to have an SNR that is closer to the average SNR of the disk surface and is therefore less variable than the SNR of a single contiguous sector of the disk surface. Because adjacent down-track locations have positively correlated SNRs, which is undesirable, embodiments preferably distribute codeword segments over locations that at least exhibit reduced SNR correlation and in the ideal case have negative SNR correlation. The distribution area can include adjacent tracks in some embodiments. Thus, embodiments can be optimized (in the ideal case) by selecting distributed segment locations that exhibit maximally negative SNR correlation. In practical cases, a zero SNR correlation or even a minimum positive SNR correlation might be an acceptable design target.

Thus an advantage of embodiments of the invention is that a capacity gain can be achieved without increasing the complexity of LDPC code and without significant change to the LDPC encoder and decoder. The embodiments also have an advantage over making a native LDPC code with 32 kB codeword, which would have increased complexity without any significant gain.

The minimum codeword distribution span/length in an embodiment in the down-track direction is determined by the correlation length of the SNR variation due to TMR, fly height variation, etc. in the particular disk drive design. The maximum SNR improvement is the difference between the worst case SNR around the track versus the average SNR around the track. Particular embodiments will be described below that apply this concept by distributing codewords in the cross-track direction as well.

One consideration in selecting the size of the individual segments of the distributed codeword (DCW) in an implementation is that, for a given LDPC design, selecting a segment size below a particular threshold can be beneficial in allowing the LDPC in erasure mode to correct an entire segment. This capability is useful when the system fails to read an entire sector due to bad synchronization or lost timing or etc. The DCW the segments of a lost physical sector belong to many different distributed codewords; therefore the lost data in each codeword is only a portion of the total. In the missing sector case, the lost bits can be flagged as "erased" since we know the physical sector could not be read properly. LDPC algorithms include a special decoding mode that can be used when a group of bits can be flagged as erased. The LDPC iterative decoder is increases in power when problem bits are flagged as erased (meaning they have no reliability. So if DCW has many segments, then an entire lost physical sector can be recovered by DCW concept together with the LDPC "erasure mode" iterative decoding.

Evaluating the gain of distributed codeword (DCW) designs can be performed by studying the variation in Bit Error Rate (BER) (proportional to SNR) in order to estimate the DCW gain. Without DCW, the performance is limited by the worst case BER observed for a LDPC codeword. With DCW, the worst case BER for a distributed LDPC codeword is improved, so the gain can be approximated by measuring the original (nondistributed) worst case BER vs. the distributed codeword worst case BER. As the distribution span increases in DCW embodiments, all BER measurements move closer to the average SNR for the track/surface. For single track DCW, an objective is to obtain distribution extending beyond the correlation length of the servo loop response. In high TPI design conditions, over 7% improvement in track squeeze capability has been measured using DCW over conventional coding.

For cross-track DCW embodiments, a main point is that when one track is squeezed, the adjacent tracks are anti-squeezed, therefore, distributing codewords across only 2 or 3 tracks can still be very effective in reducing worst case performance. If combined with a MIMO design that includes 3 parallel read heads with the capability of reading 3 tracks simultaneously, then the cross-track DCW can have excellent performance. If distribution is not also done down the track, then there will no added latency penalty.

Tradeoffs include added read latency for random read/write operations and high SRAM or DRAM memory requirements. However, distribution of codewords down-track in embodiments provides:
  Opportunity to be true On-The-Fly SNR gain
  CodeRate=1 (no additional coding)
  Combines very well with read averaging and ITIC for data recovery
  Opportunity for greatly improved defect and erasure capability. A DCW embodiment that has segments smaller than the a typical defect length, will aid in breaking a defect up and distributing it into many different codewords thus enhancing the tolerance to defects.

For convenience the size of distribution blocks and LDPC codewords will be generally referred to using the user data size which does not include the additional system overhead bits which include the parity, CRC, etc. For example, a 4 kB LDPC codeword that includes 32,768 bits (8 bits*4096 bytes) of user data might also include approximately 4000 LDPC parity bits and 96 bits of CRC flags. Modulation encoding overhead could also add approximately 1600 bits. Accordingly in embodiments the "4 kB sectors" and "4 kB codewords" are actually more than 4 kB in size. The embodiments are not dependent on the choice of a particular sector size. Sector sizes that store 512B or 4 kB of user data have been a standard for many years, but embodiments can be adapted to accommodate any sector size that is otherwise useful in a disk drive.

Figure 2A:
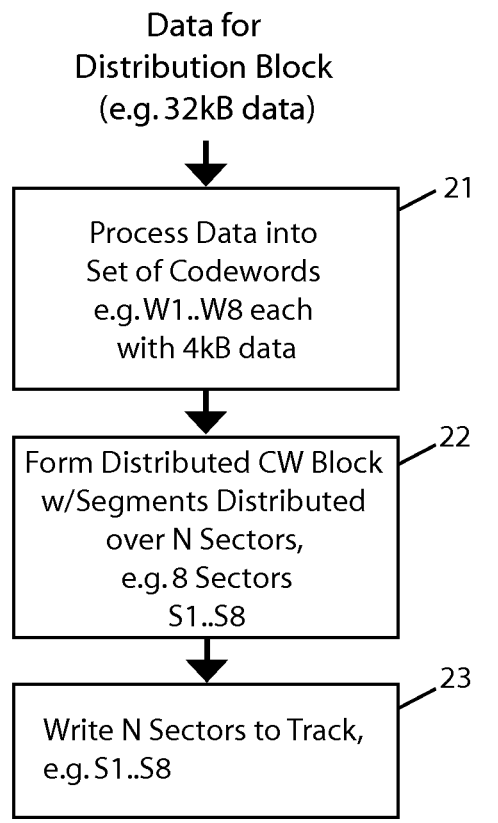
FIG. 2A is a flowchart illustrating steps in processing a block of user data into a set of codewords that are then divided into segments and distributed over a set of sectors on a track according to an embodiment.

A first embodiment using codewords distributed on a single track will be further described with reference to FIGS. 2A-2F. As illustrated in the flowchart of FIG. 2A a block of user data of a predetermined size (e.g. 32 kB) is processed as a unit to create the codeword distribution block. A block of 32 kB user data is processed into eight 4 kB sectors S1-S8 and eight LDPC codewords W1 . . . W8 that include 4 kB of user data each 21. Sectors S1-S8 can be consecutive sectors on a single representative track and form a representative codeword distribution block. Each of the plurality of tracks in disk drive will contain a plurality of distribution blocks.

Figure 2B:
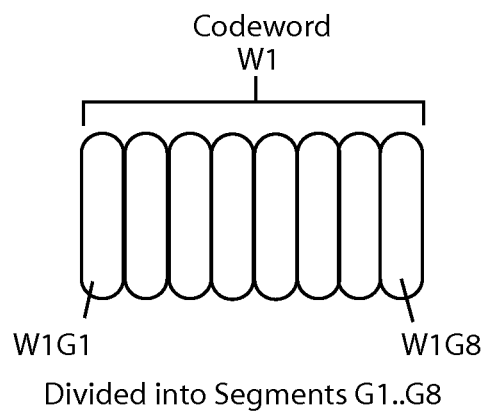
FIG. 2B is an illustration of the division of a codeword into segments according to an embodiment.

Once the eight codewords, e.g. W1 . . . W8, are formed, they are divided into a predetermined number of equal-sized segments, e.g. G1 . . . G8, as illustrated in FIG. 2B. The notation W1G1 will be used to refer to the first or G1 segment of codeword W1, W1G8 refers to the eight segment, etc. These segments are then distributed (mapped) in predetermined pattern into the needed set of sectors 22, e.g. S1-S8. The set of sectors is then written to the track in the standard manner 23. Note that the embodiment uses the same number of sectors to store the data as in the prior art, but each sector contains information that is different from what would be stored in the prior art. For example, in the prior art each of the sectors S1-S8 would typically be a self-contained codeword.

In this embodiment each sector contains one segment of each of the eight codewords and is not a codeword itself.

Figure 2C:
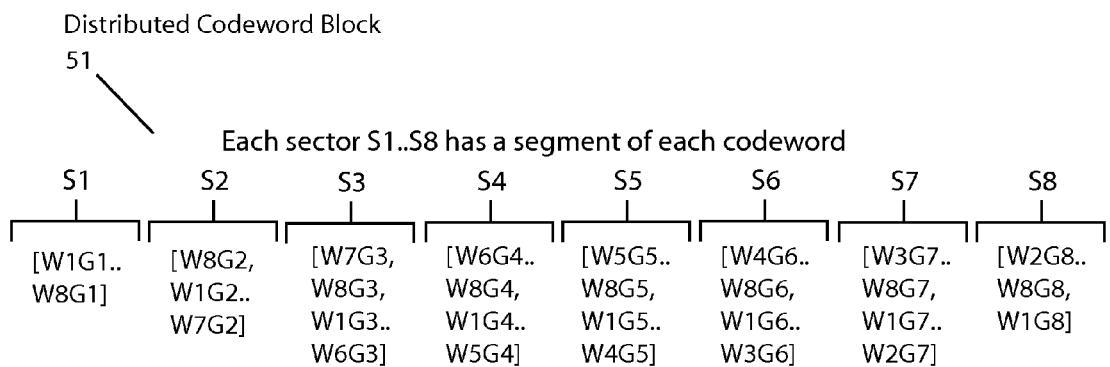
FIG. 2C is an illustration of the distribution arrangement of the segments of eight codewords in the eight sectors in a distributed codeword block as referenced in FIG. 1A according to an embodiment.
Figure 2D:
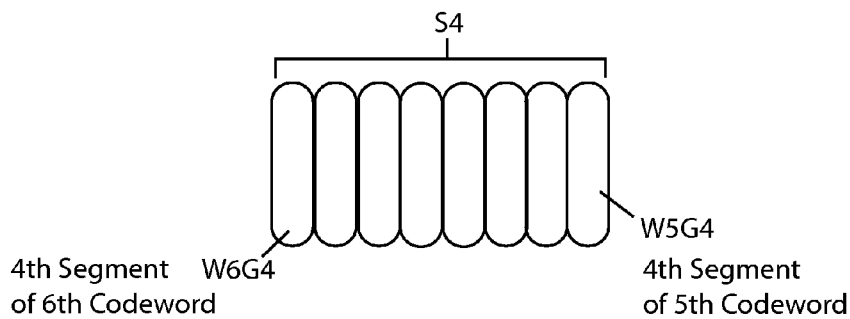
FIG. 2D is an illustration of the distribution arrangement of the segments in one of the eight selected consecutive sectors in FIG. 1C according to an embodiment.

FIG. 2C illustrates one possible pattern for distributing the segments. The distributed order of codeword segments can be selected from various possible permutations and need not be the same as illustrated. As shown in FIG. 2C, sector S1 includes the first segment (G1) of all eight codewords W1 . . . W8 in order, which are represented as: W1G1 . . . W8G1. In this embodiment, the segment order is rotated, so that in sector S4, as illustrated in FIGS. 2C-2D, the order is W6G4, W7G4, W8G4, W1G4, W2G4, W3G4, W4G4, W5G4.

Figure 2E:
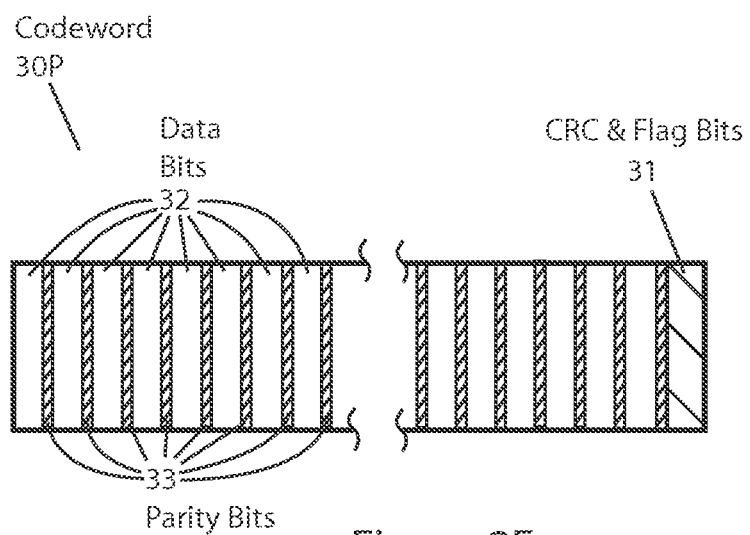
FIG. 2E is an illustration of an example of a codeword usable with embodiments in which the parity bits are distributed throughout the data and the CRC and flags bits are appended at the end.
Figure 2F:
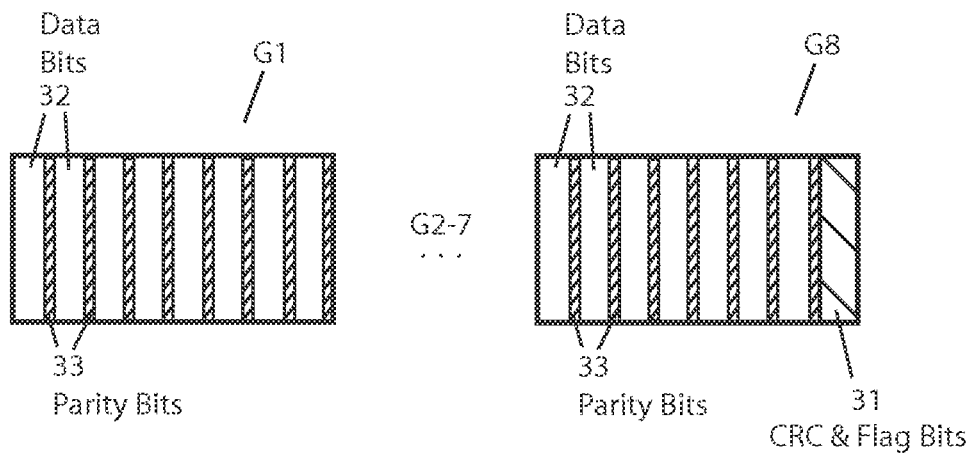
FIG. 2F is an illustration of the division of the codeword shown in FIG. 2A into segments according to an embodiment.

The system overhead bits in a codeword, which will typically include parity, CRC, modulation bits, etc., are physically placed in predetermined locations as illustrated in the sample codeword 30P as illustrated in FIG. 2E. The internal organization of the codeword can be according to prior art and is generated by codeword encoder 18 as shown in FIG. 1. Embodiments are not dependent on any particular codeword organization, because the codeword encoding and decoding is independent of the distribution and reassembly actions. In the example shown, which is a conventional LDPC codeword 30P, the parity bits 33 and modulation overhead bits (not shown) are distributed throughout the codeword, but the CRC and flag bits 31 are located at the end of the codeword. The division of a codeword into equal-sized segments G1 . . . G8 according to an embodiment as illustrated in FIG. 2B is performed without regard to the function of the bits. As shown in FIG. 2F, the G8 segment contains the CRC & flag bits 31.

Thus when the sectors in a distributed codeword block are written to disk using standard techniques, the lower level read/write channel system components do not "know" whether the bits are data, parity, CRC, etc. During the read process the sectors that are include in a distributed codeword block must be read and then decoded by reassembling the distributed segments into the respective codewords. In the context of the decoding codeword, the string bits then are treated as data, parity, etc.

The distributed codeword block in the embodiment described above is written on sectors that reside on a single track. However, the principles can also be applied by distributing codewords across two or more tracks as well. Because a significant source of SNR variation between tracks is from variations in the effective width of a track (known as track squeeze) caused by errors in radial positioning of the actuator by the servo system, embodiments that distribute each LDPC codeword in the cross-track direction are particularly effective in reducing the SNR variation from track squeeze. These embodiments are particularly synergistic with the use of Multiple-Inputs/Multiple Outputs (MIMO) technology. For example, in 3-read head MIMO, each LDPC codeword can be efficiently distributed over 3 adjacent tracks, instead of just one. Since adjacent tracks tend to have inversely correlated/different squeeze characteristics, this cross-track distribution also leads to improved SNR performance. Embodiments that only use cross track (and not down track) distribution in a MIMO disk drive will have no added latency since no additional down track reading is required to obtain the entire codeword.

Figure 3:
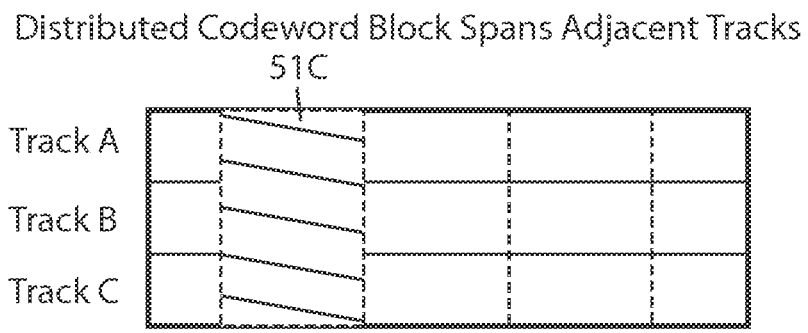
FIG. 3 is an illustration of distributed codeword block that spans across tracks according to an embodiment.
Figure 4:
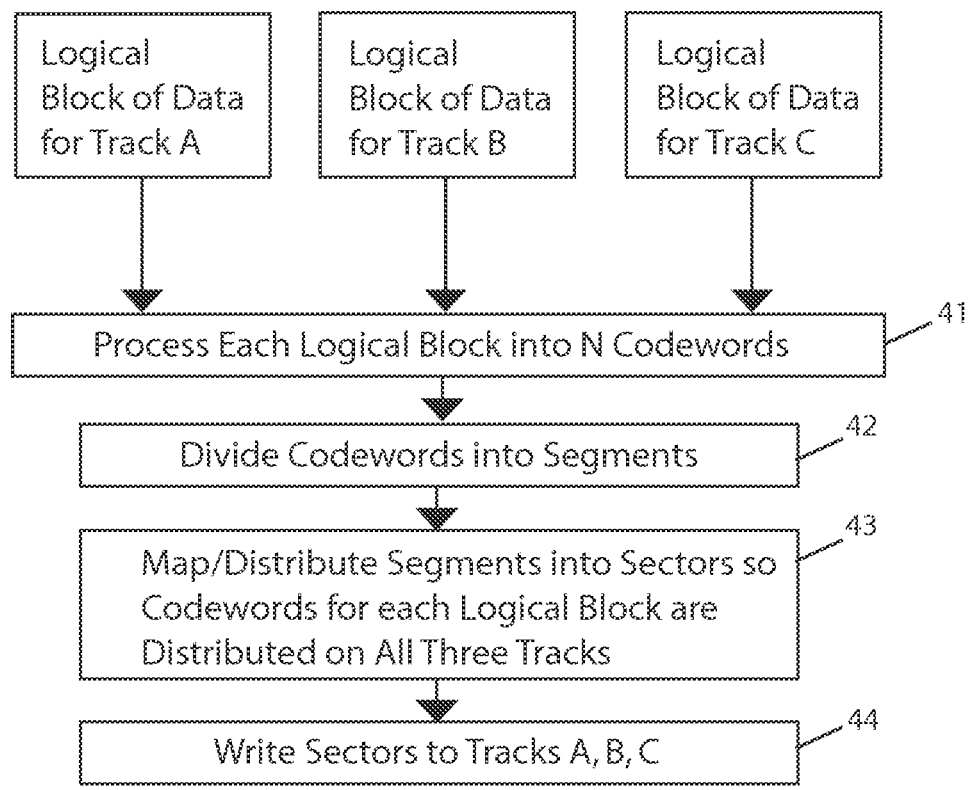
FIG. 4 is a flowchart illustrating steps in processing a block of user data into a set of codewords that are then divided into segments and distributed over a set of sectors on a track according to an embodiment.

FIG. 3 illustrates a distributed codeword block 51C that spans three adjacent tracks A, B, C. The down-track length of the block can be 1 or more sectors. FIG. 4 is a flowchart that illustrates an embodiment in which a distributed codeword block 51C is formed from input that consists of equal sized logical blocks of data that are intended to go on three adjacent tracks. The three logical blocks of data are each processed into N codewords which results in 3*N codewords 41. Just as described above for the first embodiment, each codeword is divided into a predetermined number of segments 42. These segments are then distributed/mapped into a set 3*N sectors so that the segments of each codeword are evenly divided between the three tracks and also distributed down-track within the span of the predetermined distribution block length. Using the example of an embodiment in which the block width is three tracks and the block length is one sector, there would be three codewords in the block, which would be written to three sectors. The segments would be distributed so that one third of the segments in each codeword would be written in each sector. The number of segments into which each codeword is divided should be a multiple of the number of the tracks in the block. If the length of the distributed codeword block is more than 1 sector, then the segments can also be distributed down-track as in the first embodiment as well.

The invention claimed is:

1. A method for storing and retrieving blocks of data in a disk drive that has data stored in tracks on a disk that include a plurality of sectors, the method comprising:
generating a plurality of codewords from a logical block of data, the logical block of data having a predetermined size corresponding to a selected number of sectors, each codeword containing a selected portion of the data from the logical block of data along with additional bits used for error detection;
dividing each of the plurality of codewords into a plurality of segments;
forming a distributed codeword block that corresponds to the selected number of sectors by arranging the plurality of segments of each codeword in a predetermined pattern wherein segments of each codeword are positioned in more than one sector; and
writing the distributed codeword block into the selected number of sectors on the disk, wherein a plurality of distributed codeword blocks stored on the disk and the codewords in the distributed codeword blocks have a minimum SNR that is equal to or higher than a minimum SNR for individual sectors.

2. The method of claim 1 wherein generating the plurality of codewords further comprises dividing the logical block of data in a set of equal sized units that processed by an encoder that generates a set of parity bits that are included in each codeword.

3. The method of claim 2 wherein the encoder uses a low-density parity-check (LDPC) code.

4. The method of claim 3 wherein the encoder distributes the parity bits in a predetermined plurality of positions inside each codeword.

5. The method of claim 1 wherein the additional bits used for error detection in each codeword include CRC bits.

6. The method of claim 5 wherein dividing each of the plurality of codewords into a plurality of segments, further comprises placing all of the CRC bits in a selected codeword in one segment.

7. The method of claim 1 wherein writing the distributed codeword block into the selected number of sectors on the disk, further comprises writing the selected number of sectors on at least first and second tracks wherein the distributed codeword block is distributed across at least two tracks.

8. A method for storing and retrieving logical blocks of data in a disk drive that has data stored in tracks on a disk that include a plurality of sectors, the method comprising:
generating a plurality of codewords from a logical block of data, the logical block of data having a predetermined size corresponding to a selected number of sectors, each codeword containing a selected portion of the data from the logical block of data along with additional bits used for error detection;

dividing each of the plurality of codewords into a plurality of segments;

forming a distributed codeword block that corresponds to the selected number of sectors by arranging the plurality of segments of each codeword in a predetermined pattern wherein segments of each codeword are positioned in more than one sector; and writing the distributed codeword block into the selected number of sectors on the disk, wherein a plurality of distributed codeword blocks stored on the disk and the codewords in the distributed codeword blocks have a minimum SNR that is equal to or higher than a minimum SNR for individual sectors; and wherein writing the distributed codeword block into the selected number of sectors on the disk, further comprises writing the sectors on at least first and second tracks wherein the distributed codeword block is distributed across at least two tracks; and wherein the first and second tracks are adjacent on the disk with anti-correlated squeeze and adverse effects of track squeeze are reduced by distributing the codewords across at least two tracks.

9. The method of claim 1 further comprising retrieving the logical block of data by reading the distributed codeword block, reassembling the plurality of codewords from the plurality of segments, processing the codewords through a decoder to detect errors and retrieve the selected portion of the data in each codeword, and combining the selected portions of the data to obtain the logical block of data.

10. A method for storing and retrieving logical blocks of data in a disk drive that has data stored in tracks on a disk that include a plurality of sectors, the method comprising:

generating a plurality of codewords from at least first and second logical blocks of data including sectors designated for first and second tracks, the logical blocks of data having a predetermined size corresponding to a selected number of sectors on each track, each codeword containing a selected portion of the data from the logical block of data along with additional bits used for error detection;

dividing each of the plurality of codewords into a plurality of segments;

forming a distributed codeword block that includes the selected number of sectors on each track by arranging the plurality of segments of each codeword in a predetermined pattern wherein segments of each codeword are distributed in more than one sector and on more than one track; and writing the distributed codeword block into the selected number of sectors on at least first and second tracks on the disk, wherein the codewords in the distributed codeword blocks have a minimum SNR that is equal to or higher than a minimum SNR for individual sectors.

11. The method of claim 10 wherein generating the plurality of codewords further comprises dividing the logical block of data in a set of equal sized units that processed by an encoder that generates a set of parity bits that are included in each codeword.

12. The method of claim 11 wherein the encoder uses a low-density parity-check (LDPC) code.

13. The method of claim 12 wherein the encoder distributes parity bits in a predetermined plurality of positions inside each codeword.

14. The method of claim 10 wherein the additional bits used for error detection in each codeword include CRC bits.

15. The method of claim 14 wherein dividing each of the plurality of codewords into a plurality of segments, further comprises placing all of the CRC bits in a selected codeword in one of the segments of the selected codeword.

16. A method for storing and retrieving logical blocks of data in a disk drive that has data stored in tracks on a disk that include a plurality of sectors, the method comprising:

generating a plurality of codewords from at least first and second logical blocks of data including sectors designated for first and second tracks, the logical blocks of data having a predetermined size corresponding to a selected number of sectors on each track, each codeword containing a selected portion of the data from the logical block of data along with additional bits used for error detection;

dividing each of the plurality of codewords into a plurality of segments;

forming a distributed codeword block that includes the selected number of sectors on each track by arranging the plurality of segments of each codeword in a predetermined pattern wherein segments of each codeword are distributed in more than one sector and on more than one track; and writing the distributed codeword block into the selected number of sectors on at least first and second tracks on the disk, wherein the codewords in the distributed codeword blocks have a minimum SNR that is equal to or higher than a minimum SNR for individual sectors; and wherein the first and second tracks are adjacent on the disk with anti-correlated squeeze and adverse effects of track squeeze are reduced by distributing the codewords across at least two tracks.

17. A disk drive comprising:

a codeword encoder;

a codeword block distribution unit that processes a logical block of data corresponding to a selected number of sectors into a plurality of codewords using the codeword encoder, divides each codeword into a plurality of segments and distributes the plurality of segments of each codeword in a predetermined pattern in a distributed codeword block that spans the selected number of sectors so that the segments of each codeword are distributed between a plurality of sectors; and a read/write channel that writes the distributed codeword block on one or more tracks on the disk, wherein the codewords in the distributed codeword blocks have a minimum SNR that is equal to or higher than a minimum SNR for individual sectors.

* * * * *